US006629276B1

(12) United States Patent
Hoffman et al.

(10) Patent No.: US 6,629,276 B1
(45) Date of Patent: Sep. 30, 2003

(54) METHOD AND APPARATUS FOR A SCANNABLE HYBRID FLIP FLOP

(75) Inventors: Joseph A. Hoffman, Chandler, AZ (US); Joseph W. Yoder, Oakton, VA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 09/559,660

(22) Filed: Apr. 28, 2000

Related U.S. Application Data (60) Provisional application No. 60/131,925, filed on Apr. 30, 1999.

(51) Int. Cl.[7] .......................... G01R 31/28; H03L 7/00; G06F 1/04
(52) U.S. Cl. ....................... 714/726; 327/144
(58) Field of Search .................. 714/726; 327/291, 327/293, 295, 144

(56) References Cited

U.S. PATENT DOCUMENTS

| | | | |
|---|---|---|---|
| 4,277,699 A | 7/1981 | Brown et al. ............. 307/272 |
| 4,602,210 A | 7/1986 | Fasang et al. ............ 324/73 |
| 4,689,497 A | 8/1987 | Umeki et al. ............. 307/272 |
| 4,692,634 A | 9/1987 | Fang et al. .............. 307/272.1 |
| 4,785,200 A | 11/1988 | Huntington .............. 307/279 |
| 4,864,161 A | 9/1989 | Norman et al. ............ 307/272.2 |
| 4,972,414 A | * 11/1990 | Borkenhagen et al. ...... 714/731 |
| 5,155,432 A | 10/1992 | Mahoney ............... 324/158 |
| 5,396,501 A | 3/1995 | Sengoku ............... 371/22.3 |
| 5,459,735 A | 10/1995 | Narimatsu .............. 371/22.3 |
| 5,463,338 A | * 10/1995 | Yurash ................ 327/202 |
| 5,491,699 A | 2/1996 | Scheuermann et al. ..... 371/22.1 |
| 5,598,120 A | 1/1997 | Yurash ................ 327/202 |
| 5,640,114 A | 6/1997 | El-Ziq et al. ............ 327/202 |
| 5,689,517 A | * 11/1997 | Ruparel ................ 714/731 |
| 5,717,700 A | * 2/1998 | Crouch et al. ........... 714/726 |
| 5,719,878 A | * 2/1998 | Yu et al. ............... 365/230.06 |
| 5,748,645 A | * 5/1998 | Hunter et al. ............ 714/726 |
| 5,867,507 A | * 2/1999 | Beebe et al. ............ 714/726 |
| 5,920,575 A | * 7/1999 | Gregor et al. ........... 714/726 |
| 6,032,278 A | * 2/2000 | Parvathala et al. ........ 714/726 |
| 6,127,864 A | * 10/2000 | Mavis et al. ............ 327/144 |

FOREIGN PATENT DOCUMENTS

EP 0 651 566 A1 9/1994 ............. H04N/5/33

OTHER PUBLICATIONS

IBM Technical Disclosure Bulletin; vol. 33, No. 3B, dated Aug. 1990, "High–Performance CMOS Register" pp. 363–366.

International Search Report, dated Jan. 3, 2001, International Application No. PCT/US 00/11348.

* cited by examiner

*Primary Examiner*—Albert Decady
*Assistant Examiner*—Anthony T. Whittington
(74) *Attorney, Agent, or Firm*—Swidler Berlin Shereff Friedman, LLP (57) ABSTRACT

A scannable flip flop for space-based LSSD testable integrated circuits. A scannable register can be formed from the scannable flip flops. The scannable flip flops can be radiation hardened. Each scannable flip flop can include a 2:1 input multiplexer, a first latch and a second latch. The input multiplexer is coupled to the first latch by a pair of pass gates. The pass gates are gated by a first clock input signal. A second pass gate pair couples the first latch to the second latch. A second clock input signal gates the second pass gate pair. The first and second clock input signals are non-overlapping. The latch can be employed in edge triggered logic ECAD tools for designing IC. The resulting IC logic can be tested using LSSD test testing techniques and patterns.

24 Claims, 7 Drawing Sheets

METHOD AND APPARATUS FOR A SCANNABLE HYBRID FLIP FLOP

RELATED APPLICATION

The present invention is related to U.S. patent applications Ser. No. 09/559,659 entitled "Method and Apparatus for a SEU Tolerant Clock Splitter" to Hoffman and Ser. No. 60/131,925 entitled "Method and Apparatus for Clock Splitters" to Yoder et al., the contents of which are incorporated herein by reference in their entireties, filed coincident herewith and of common assignee to the present application.

BACKGROUND OF THE INVENTION

1. Field of the Invention

The present invention is related to radiation hardened integrated circuits and, more particularly, to scannable latches for radiation hardened integrated circuits.

2. Background Description

Increasingly, space-based communication systems are including Integrated Circuits (IC) made in advanced deep sub-micron Field Effect Transistor (FET) technology. Typically, these ICs are in the insulated gate silicon technology commonly referred to as complementary metal oxide semiconductor (CMOS). CMOS ICs are advantageous in that they operate at high speed and use low power, as compared to what other technologies require for comparable speed and function.

In a space-based environment, however, ionic strikes by sub-atomic cosmic particles are known to introduce circuit disturbances. These disturbances are known as Single Event Effects (SEEs) and, as Single Event Upsets (SEUs) when occurring in storage elements. Radiation hardened storage elements latches are well known and are used, effectively, to reduce or eliminate SEE in space based IC registers, latches and other storage elements. These radiation hardened storage elements can be referred to as radiation hardened latches and are designed to protect from disturbance what is stored in them in spite of any cosmic particle hits that the storage elements might sustain.

Figure 1:
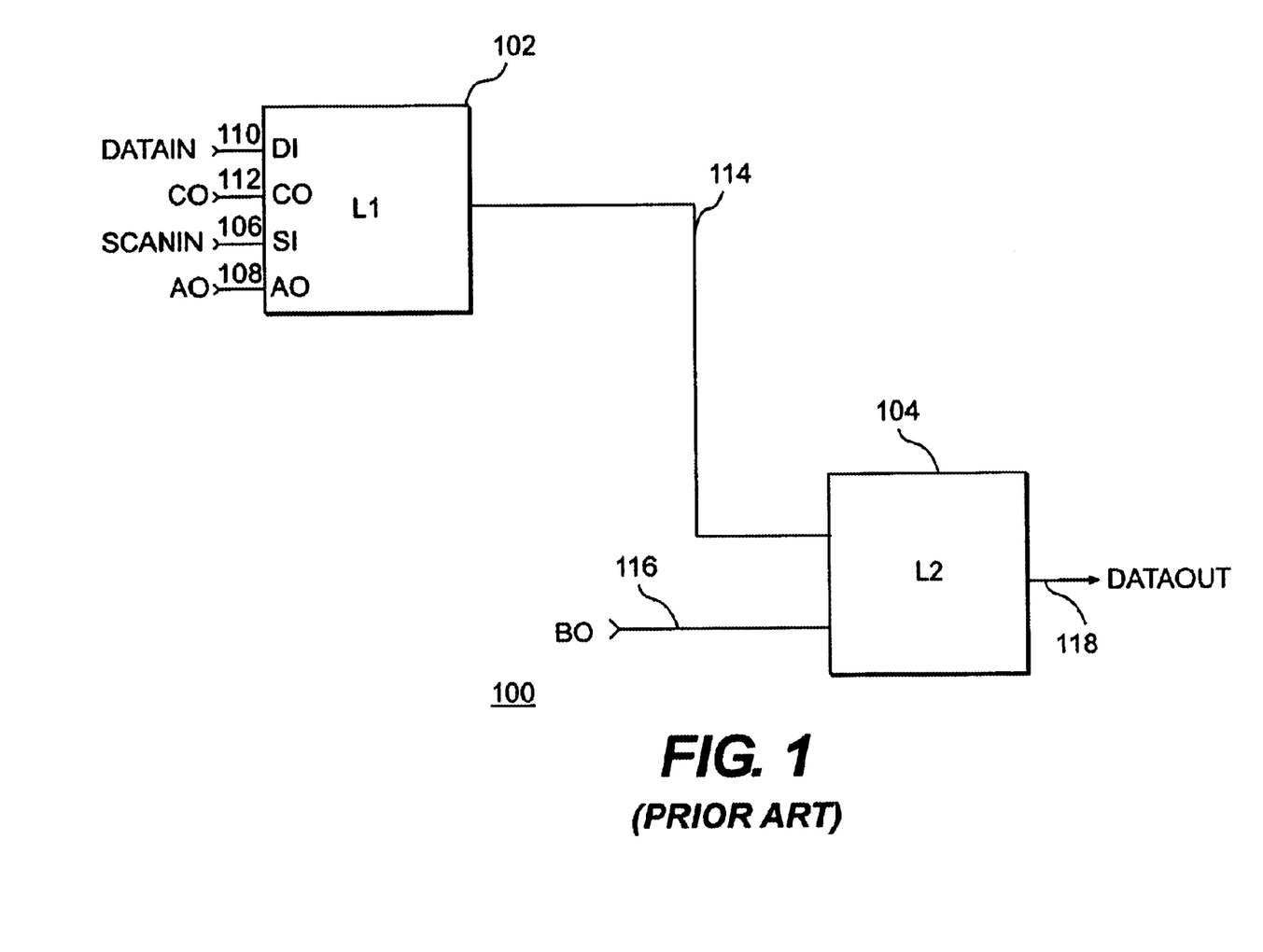
FIG. 1 is an example of a conventional LSSD latch.

In the past, level sensitive scan design (LSSD) latches were used in spaced-based applications to reduce an integrated circuit's SEE sensitivity. FIG. 1 is a block diagram of a conventional LSSD latch 100. The LSSD latch 100 includes a first stage 102 and a second stage 104. The first stage 102 includes a serial input SCANIN (SI) 106 clocked by a clock A0 signal 108 and a data input DATAIN (DI) 110 clocked by a clock C0 signal 112. An output 114 of the first stage 102 is the input of the second stage 104 which is clocked by a clock B0 signal 116. An output DATAOUT 118 of the second stage 104 is an output P10 of the LSSD latch 100.

Typically, LSSD latches 100 are linked together serially to form several scan chains on a chip by connecting the output DATAOUT 118 of one LSSD latch 100 (in addition to its normal logic path connection) to the SCANIN input 106 of the next LSSD latch 100 in the chain. The IC logic is designed such that logic functions are bounded by scan chains. Thus, test data may be scanned in on one scan chain, at the input to the particular logic function and the logic function's response to the test data may be scanned out on another chain at the logic function's output. The data scanned out may be compared against an expected result and analyzed to determine if and where logic errors exist in the function.

During normal operation, the C0 and B0 clock signals 112 and 116 are non-overlapping phases derived from the same system clock. During each clock cycle, data at data input DATAIN 110 is latched in the first stage 102 when the C0 clock signal 112 is driven high. Then, after the first stage latch 102 has set, the C0 clock signal 112 is driven low. Next, the B0 clock signal 116 is driven high, passing the contents of the first stage 102 to the second stage 104. As the second stage is setting, the stored data passes out of the second stage on output P10 DATAOUT 118 and the second stage is set when the B0 clock signal 116 is driven low. The next clock cycle begins when the C0 clock signal 112 is again driven high.

During testing, initially, the C0 clock signal 112 is held low for all latches 100. Data is scanned in serially on the scan input SCANIN 106 by driving the A0 clock signal 108 (for one or more scan chains) with the B0 clock signal 116 until the entire test pattern has been scanned into the chain. Typically, test data is loaded into all of the scan chains, either individually or, several at a time. Once the test pattern has been scanned into each selected input test chain and the stored test pattern data has had time to pass through the function, the C0 clock signal 112 is pulsed with a single pulse to clock the function output into first stage 102 of all of the LSSD latches 100. The single pulse of C0 clock signal 112 is followed by a pulse on the B0 clock signal 116 to pass the function results to the second stage 104 of the LSSD latches. Then, the results are scanned out of the scan chains, driving individual scan chain A0 clock signal 108 with the B0 clock signal 116. Thus, individual logic functions can be tested, extensively, providing a high degree of functional certainty.

Unfortunately, modern electronic computer automated design (ECAD) tools, which are directed more to automated test pattern generation (ATPG), are incompatible with LSSD. These modern ECAD tools are incapable of using the multiple clock signals (A0, B0 and C0) 108, 116, and 112 that LSSD latches 100 require. Instead, these modem ECAD tools are adapted for logic circuits implemented using edge-triggered latches.

Figure 2:
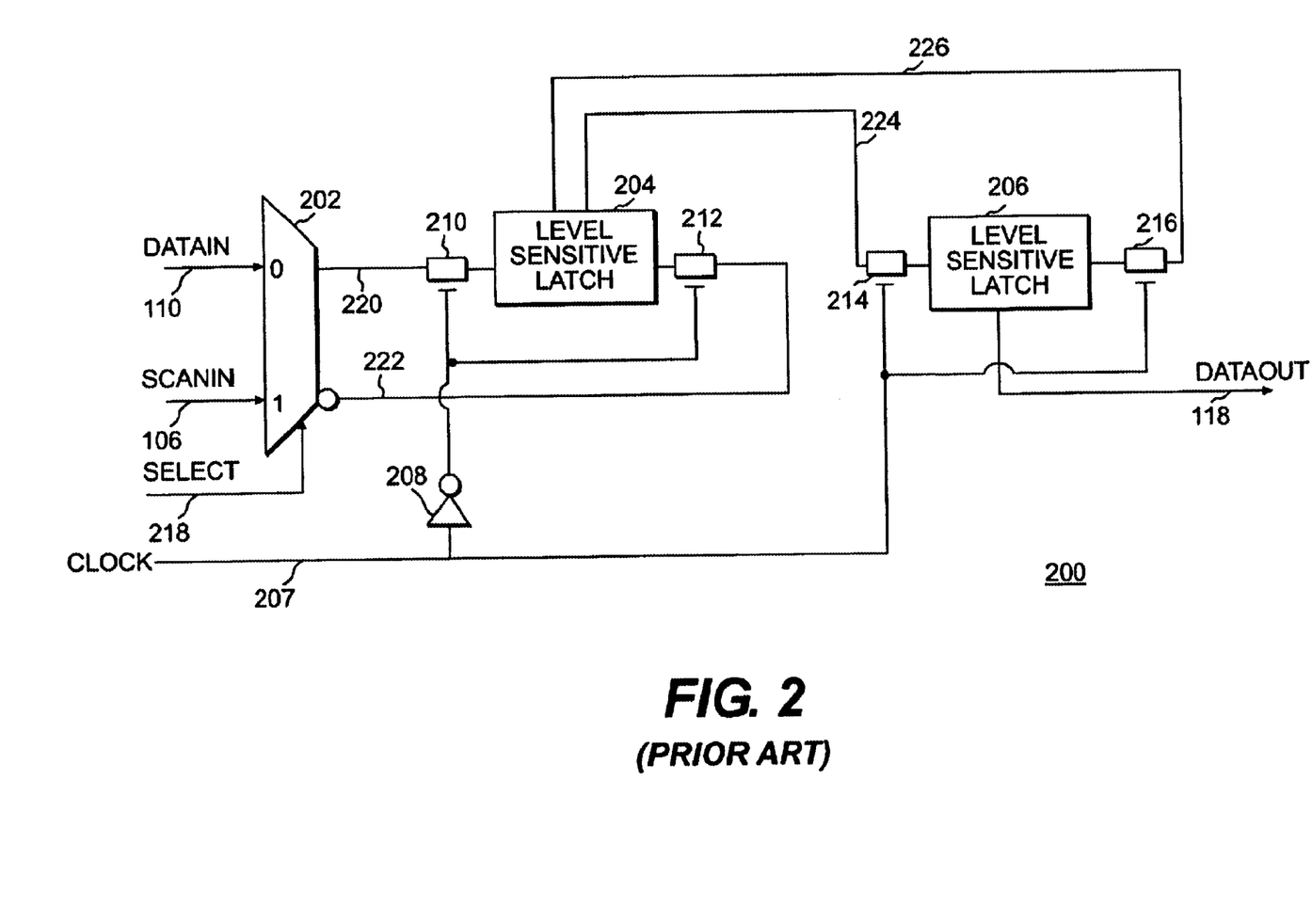
FIG. 2 is an example of a typical conventional scan d-flip-flop (scan dff)

Edge-triggered latches set on the falling or rising edge of a single clock. For example, FIG. 2 illustrates a conventional scan d-flip-flop (scan dff) 200. The scan d flip-flop 200 includes a 2:1 multiplexer 202, which is coupled to a first level sensitive latch 204. The first level sensitive latch 204 is coupled to a second level sensitive latch 206. The scan dff 200 is clocked by a clock signal 207. The clock signal 207 is split into complementary signals by inverting clock signal 207 with inverter 208. The complementary clock signals are provided to first level sensitive latch 204 and second level sensitive latch 206, gating first and second pairs of pass gates 210, 212 and 214, 216, respectively.

When selected by select signal 218, the DATAIN 210 input passes through the 2:1 multiplexer 202 to the first pair of pass gates 210, 212 as complementary outputs 220, 222. When the clock signal 207 is low, pass gates 210, 212, are turned on so that data on complementary outputs 220, 222 are passed to first level sensitive latch 204 and, tentatively, are stored therein. With the clock signal 207 low, the second pair of pass gates 214, 216 are contemporaneously turned off, and isolate the second level sensitive latch 206 from the outputs 224, 226 of the first level sensitive latch 204.

The rising edge of clock signal 207 turns on the second pair of pass gates 214, 216 as the output of inverter 208 falls, simultaneously, to turn off the first pair of pass gates 210, 212. When the first pair of pass gates 210, 212 are turned off, the complementary outputs 220, 222 are isolated from the first level sensitive latch 204 and, so, data is latched in the first level sensitive latch 204. When the second pair of pass gates 214, 216 are turned on, outputs 224, 226 of the first level sensitive latch 204 are passed to the second-level sensitive latch 206. The state of outputs 224, 226 is stored, tentatively, in the second level sensitive latch 206 and, simultaneously, is passed out on an output DATAOUT 118. When clock signal 207 falls, on the next clock cycle, the second pair of pass gates 214, 216 are turned off, isolating the second level sensitive latch 206 from the first level sensitive latch 204, latching data in the second level sensitive latch 206 to complete the clock cycle.

Normally, when the clock signal 207 is well behaved with regularly spaced high and low periods, it is sufficient that data provided to the input DATAIN 110 meet setup (i.e., be valid for a specified period prior to the rise of clock signal 207) and hold (i.e., remain valid for a specified period after the rise of clock signal 207) timing requirements. At any other time, other than when clock signal 207 is rising, the state of DATAIN input signal 110 is specified as a "don't care" condition.

Unfortunately, an upsetting event occurring in the clock tree prior to clock signal 207 can cause a false clock pulse on clock signal 207. Since input DATAIN 110 is specified as a "don't care," a falling edge of a false clock pulse could cause the first level sensitive latch 204 to switch states, inadvertently storing data. Further, when the input clock returns high, that invalid level is passed to the second level sensitive latch 206 and out of the scan dff 200 on output DATAOUT 118. The false clock pulse is a pulse perturbated by an SEE.

Additionally, this scan dff 200 is both incompatible with LSSD and is even more sensitive to SEE than LSSD latches. This increased sensitivity is because either the first level sensitive latch 204 or the second level sensitive latch 206 is always being gated actively. An event occurring at, or before, inverter 208 can clock the entire flip flop 200 or the second level sensitive latch 206. Furthermore, because an event occurring in the clock tree is, most likely, reflected by errors in chip latches and registers, each clock must be hardened against SEE, which increases clock power requirements and complicates SEE hardening. As a consequence, edge triggered logic, also, is power constrained.

Thus, for reasons stated above, and for other reasons, including those stated below, and that will become apparent to those skilled in the relevant art upon reading and understanding the present specification, what is needed is a scannable edge-triggered latch that is compatible with LSSD methodology, while having reduced SEE sensitivity.

SUMMARY OF THE INVENTION

The above mentioned problems with clock generation circuits and radiation hardened storage elements and other problems which will be understood by reading and studying the following specification, are addressed by the present invention.

The present invention in an example embodiment can include a scannable flip flop for space-based level sensitive scan design (LSSD) testable, edge-trigger design for integrated circuits. A scannable register may be formed from the scannable flip flops. The scannable flip flops can be radiation hardened. Each scannable flip flops can include a 2:1 input multiplexer, a first latch and a second latch. The multiplexer can be coupled to the first latch by a pair of pass gates. The pass gates can be gated by a clock signal (C0). A second pass gate pair can couple the first latch to the second latch. A second clock signal (B0) can gate the second pass gate pair.

The clock signals can be non-overlapping and can be provided by a clock splitter that splits a chip clock into two individual clock phase signals. The latch and clock splitter combination can be employed as edge-triggered logic. Representing the LSSD testable circuit as an edge-triggered D-flip flop in ECAD tools permits logic synthesis and scan string creation using D-flip flop based tools. The resulting logic can operate as edge-triggered logic and can be tested using LSSD testing techniques and patterns.

An example embodiment of the present invention includes an integrated circuit including an input multiplexer, a first latch selectively coupled to an output of the input multiplexer, a second latch selectively coupled to an output of the first latch, a first clock input signal selectively coupling the first latch to the input multiplexer output, and a second clock input signal, non-overlapping and separate from the first clock input, selectively coupling the first latch to the second latch.

In one example embodiment of the present invention the input multiplexer is a 2:1 input multiplexer.

In one example embodiment of the present invention the input multiplexer includes a scan input signal and a data input signal.

In one example embodiment of the present invention the first latch is coupled to the input multiplexer by a first pair of pass gates, the first pair of pass gates being gated by the first clock input signal.

In one example embodiment of the present invention the second latch is coupled to the first latch by a second pair of pass gates, the second pair of pass gates being gated by the second clock input signal.

In one example embodiment of the present invention the first clock input signal is coupled to a first clock input signal of at least one other flip flop for space-based integrated circuits and the second clock input signal is coupled to a second clock input signal of the at least one other flip flop.

Another example embodiment of the present invention includes an integrated circuit including at least one scannable register, the at least one scannable register including a plurality of flip flops, each of the plurality of flip flops including an input multiplexer, a first latch, a first pass gate pair selectively coupling an output of the input multiplexer to an input of the first latch, a second latch, and a second pass gate pair selectively coupling an output of the first latch to an input of the second latch, a first clock input signal selectively coupling the input of the first latch to the output of the input multiplexer, and a second clock input signal non-overlapping and separate from the first clock input, selectively coupling the output of the first latch to the input of the second latch.

In one example embodiment of the present invention the input multiplexer is a 2:1 input multiplexer.

In one example embodiment of the present invention the input multiplexer includes a scan input and a data input, the plurality of flip flops being serially coupled into a scan string, an output of a first of the plurality of flip flops of the scan string being coupled to a scan input of a next of the plurality of flip flops of the scan string.

In one example embodiment of the present invention a scan input of each remaining of the plurality of flip flops is coupled to an output of another of the plurality of flip flops.

In one example embodiment of the present invention the at least one scannable register is one or more pairs of the scannable registers, a first of each of the pairs of scannable registers providing an input to a logic circuit and a second of each of the pairs of scannable registers receiving an output of the logic circuit.

In another example embodiment of the present invention, an integrated circuit including a plurality of logic circuits providing a plurality of logic functions, a first clock input signal, a second clock input signal non-overlapping and separate from the first clock input signal, a plurality of scannable registers for storing inputs to the plurality of logic functions and outputs from the plurality of logic functions, each of the plurality of scannable registers including a plurality of latches, wherein each of the plurality of latches includes an input multiplexer selecting between a scan input and a data input, a first latch selectively coupled to an output of the input multiplexer responsive to the first clock input signal, the first latch storing a state of the output of the input multiplexer, and a second latch selectively coupled to an output of the first latch responsive to the second clock input signal, the second latch storing a state of the output of the first latch and providing a latch output responsive to the state of the output of the first latch stored in the second latch, and each of the inputs to the plurality of logic functions being one of the latch outputs from one of the plurality of scannable registers, and each of the outputs from the plurality of logic functions being an input to another of the plurality of scannable registers.

In one example embodiment of the present invention the input multiplexer is a 2:1 input multiplexer.

In one example embodiment of the present invention the input multiplexer includes a scan input and a data input, the plurality of latches being serially coupled into one or more scan strings, an output of a first of the plurality of latches of the scan string being coupled to a scan input of a next of the plurality of latches of the scan string.

In one example embodiment of the present invention a scan input of each remaining of the plurality of latches is an output of another of the plurality of latches, and wherein during a test operation test pattern, data is scanned into one of the scan strings and test result data is scanned out of a second one of the scan strings.

In one example embodiment of the present invention, the circuit further includes a clock splitter, receiving a chip clock input signal and generating the first input clock signal and the second input clock signal responsive to the chip clock.

In another example embodiment of the present invention, flip flop for edge-triggered integrated circuits, the flip flop including a 2:1 input multiplexer, a first pair of pass gates having inputs coupled to a pair of outputs of the 2:1 input multiplexer, a first latch having inputs coupled to outputs of the first pair of pass gates, a second pair of pass gates having inputs coupled to a pair of outputs of the first latch, a second latch having inputs coupled to outputs of the second pair of pass gates, a first clock input signal gating the first pair of pass gates, and a second clock input signal, gating the second pair of pass gates, wherein the first clock signal and the second clock signal are non-overlapping separate clock signals, wherein during test the flip flop can be functionally tested using LSSD testing techniques and during normal operation the flip flop can operate as an edge-triggered flip flop.

In one example embodiment of the present invention the first latch and the second latch are radiation hardened latches.

In one example embodiment of the present invention the 2:1 input multiplexer includes a scan input and a data input, the flip flop being serially coupled with additional of the flip flops into one or more scan strings, an output of a first the flip flop of each of the scan strings being coupled to a scan input of a next the flip flop of the scan string.

In one example embodiment of the present invention the scan input of each remaining of the additional of the flip flops is an output of another of the additional the flip flops, wherein during a test operation test pattern data is scanned into one of the scan strings and test result data is scanned out on a second one of the scan strings.

In one example embodiment of the present invention the flip flop, when clocked by an SEU tolerant clock splitter, can be represented as a scan d flip flop for ECAD logic synthesis.

In another example embodiment of the present invention, a method of operating an integrated circuit (IC), the IC having a test mode of operation and a functional mode of operation, the method including the steps of configuring the IC in its test mode and testing the IC using LSSD test methods, and configuring the IC in its functional mode and providing a clock to an input to the IC, wherein single event upsets occurring in clock trees on the ICs are not propagated as clock pulses to latches on the IC.

In one example embodiment of the present invention the step of configuring the IC in test mode and testing includes selecting a scan input to one or more scannable registers, scanning a plurality of test patterns into the one or more scannable registers, allowing the test patterns to propagate through logic being tested on the IC to an input to an other scannable register, latching logic test results in the other scannable register, scanning test results out of the other scannable register, and checking the test results for failures and analyzing any the failures to determine a cause for each of the failures.

In one example embodiment of the present invention for any IC determined not to contain failures, the step of configuring the IC in functional mode includes configuring the scannable registers to select a data input, providing a clock to the IC, splitting the clock into one or more pairs of complementary clocks, and providing the pairs of complementary clocks to the scannable registers, wherein the registers are clocked by the pairs of complementary clocks, a first of each the pair loading data into first level sensitive latches and the second of the each pair passing the loaded data into second level sensitive latches.

It is an advantage of the invention that space-based integrated circuit (IC) testability is improved.

It is another advantage of the present invention that SEU sensitivity of space-based ICs is reduced.

It is yet another advantage of the present invention that it provides improved space-based IC chip design compatibility with LSSD techniques.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digits in the corresponding reference number.

BRIEF DESCRIPTION OF THE DRAWINGS

The foregoing and other features and advantages of the invention will be apparent and better understood from the following more particular description of a preferred embodiment of the invention, as illustrated in the accompanying drawings, in which.

DETAILED DESCRIPTION OF AN EXAMPLE EMBODIMENT OF THE INVENTION

In the following detailed description of illustrative embodiments of the present invention, reference is made to the accompanying drawings which form a part hereof, and in which are shown by way of illustration specific illustrative embodiments in which the invention can be practiced. These embodiments are described in sufficient detail to enable those skilled in the art to practice the invention and it is to be understood that other embodiments can be used and that logical, mechanical and electrical changes can be made without departing from the spirit and scope of the present invention. The following detailed description is, therefore, not to be taken in a limiting sense.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high, however, an asterisk (*) following the signal name in this application indicates that the signal is negative or inverse logic. Negative or inverse logic is considered active when the signal is low.

Figure 3:
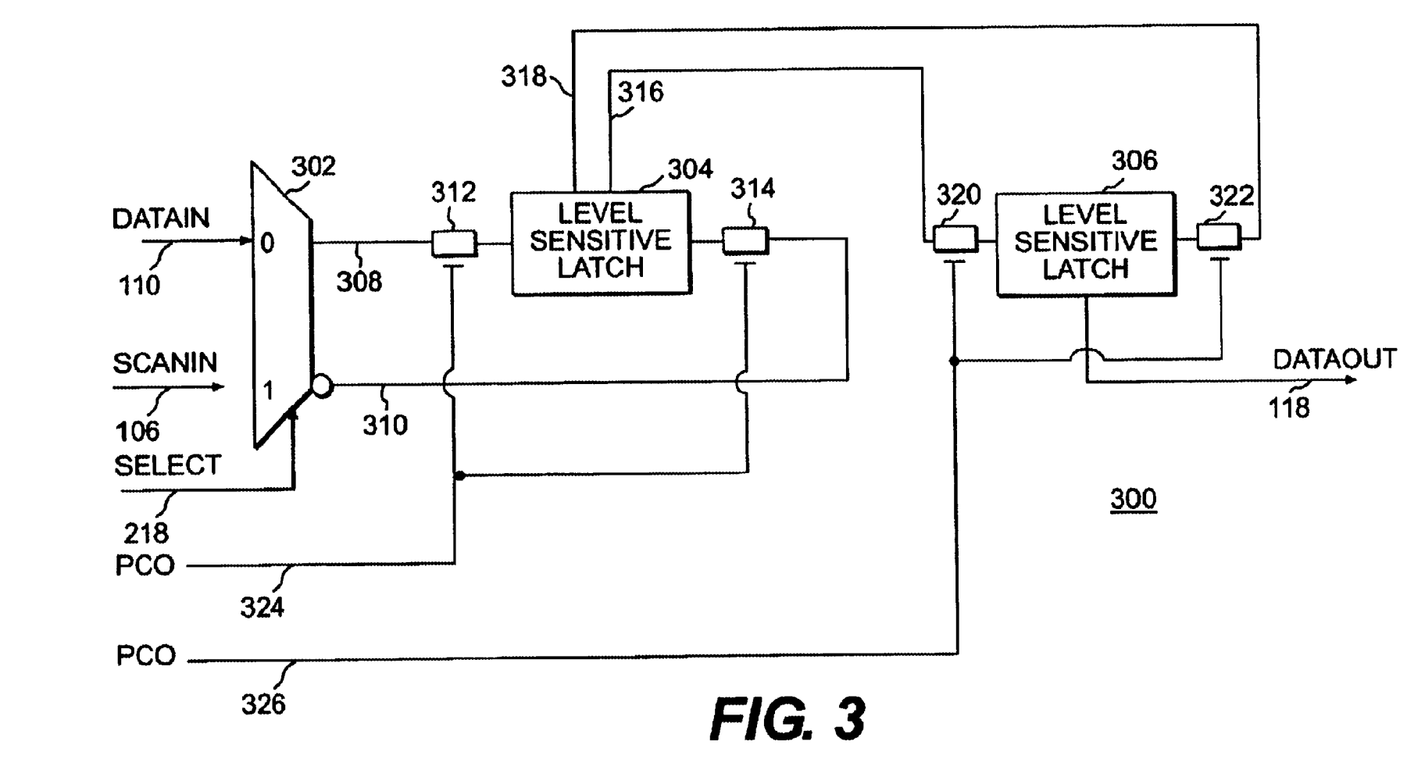
FIG. 3 is an exemplary embodiment of a scannable hybrid flip flop.

Turning now to the drawings and, more particularly, to FIG. 3 is a schematic of a exemplary embodiment of a scannable hybrid flip flop 300. The scannable hybrid flip flop 300 can include a 2:1 multiplexer 302, a first level sensitive latch 304 and a second level sensitive latch 306. Complementary outputs 308, 310 of 2:1 multiplexer 302 can be inputs to the first level sensitive latch 304 through pass gates 312, 314. Outputs 316, 318 of the first level sensitive latch 304 can be inputs to the second level sensitive latch 306 through pass gates 320, 322, respectively. Each level sensitive latch 304, 306 is clocked by non-overlapping and separate clock signals PC0 324 and PC0 326, respectively.

Either data input DATAIN 110 or scan test data SCANIN 106 is passed through 2:1 multiplexer 302 depending on the state of selector input select 218. The outputs 308, 310 of 2:1 multiplexer 302 can be coupled to pass gates 312 and 314. Thus, when pass gates 312 and 314 are on, as selected by first independent clock signal PC0 324, the outputs 308, 310 of 2:1 multiplexer 302 are passed into first level sensitive latch 304. After storing data in the first level sensitive latch 304 the PC0 clock signal 324 can be driven low to turn off pass gates 312 and 314. Then, the PB0 clock signal 326 can be driven high, which turns on pass gates 320 and 322, passing data into second level sensitive latch 306. As data is passed into second level sensitive latch 306 it, simultaneously passes out on output DATAOUT 118.

Unlike conventional scan dff 200, since the exemplary embodiment of hybrid flip flop 300 includes two independently clocked level sensitive latches 304, 306, the clock stages preceding the latches 304, 306 are not sensitive to SEE induced falling pulses. As noted above, both LSSD clocks may not be high simultaneously. However, driving both clocks low simultaneously merely pauses flip flop operation. Thus, a false low pulse during a clock period, i.e. when the clock is high, typically, would be ignored because the input to the latch (either from the 2:1 multiplexer 302 or, for the second latch 306, from the first latch 304) is constrained to be stable only during the clock transition, not the entire clock period. So, either the latch would latch as intended or remain latched.

However, when the clock is low, the latch is stable and the latch input is at an indeterminate state. An SEE induced false high pulse could upset the stable latch. Thus, the exemplary embodiment latches 304, 306 need only be hardened against SEE induced false high pulses.

Figure 4A:
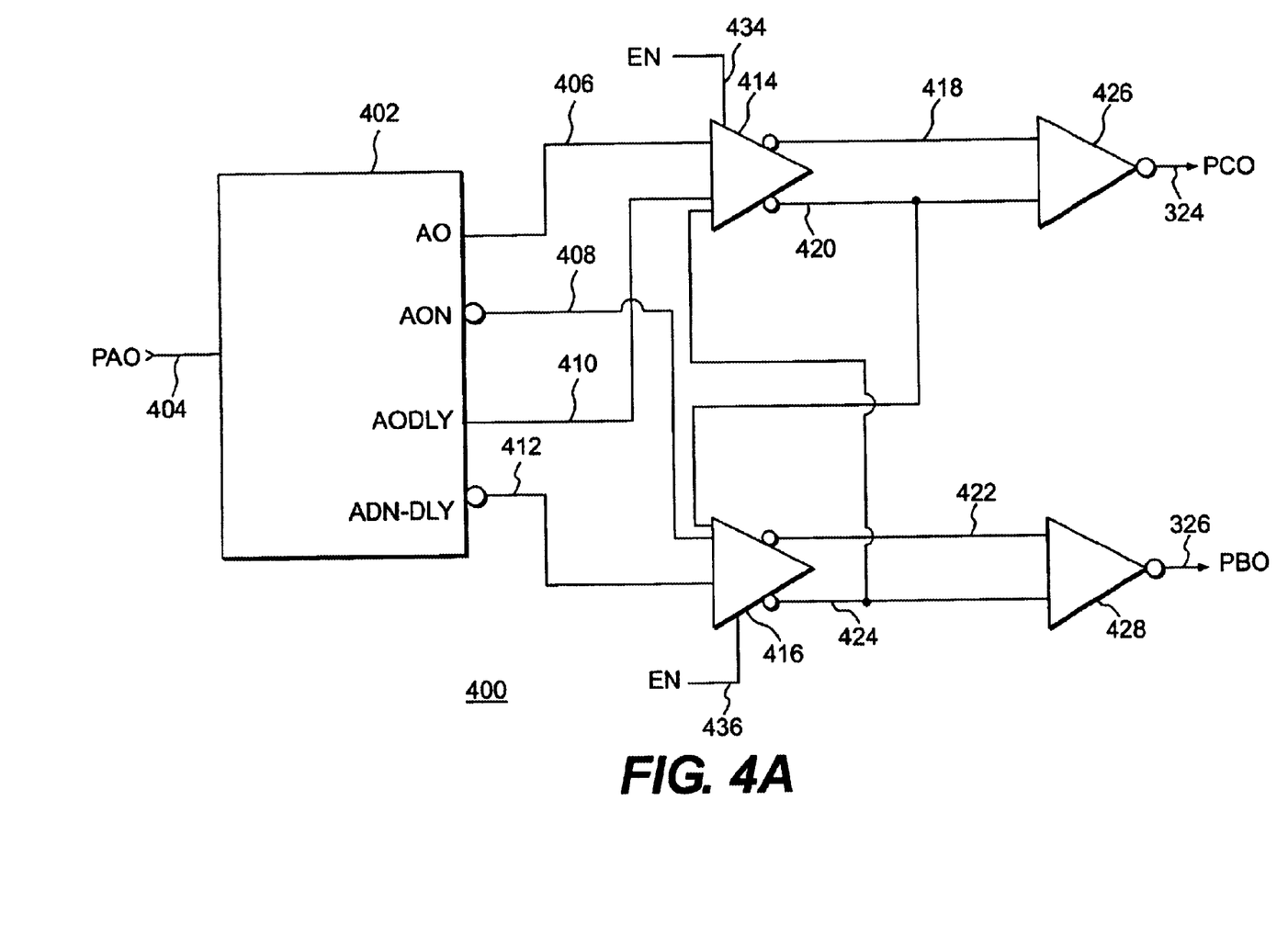
FIG. 4A is a block diagram of an exemplary embodiment of a single event upset (SEU) tolerant clock splitter circuit of the present invention.

Accordingly, FIG. 4A is a block diagram of an exemplary embodiment of a Single Event Upset (SEU) tolerant clock splitter circuit 400, as described in detail in U.S. patent application Ser. No. 09/559,659 (Attorney Docket No. FE-00352) entitled "Method And Apparatus For a SEU Tolerant Clock Splitter" to Hoffman, filed coincident herewith, of common assignee to the present application, the contents of which are incorporated herein by reference in their entireties. The SEU tolerant clock splitter circuit 400 by eliminating inverter 208 avoids the SEE sensitivity of the inverter 208 and avoids false pulses from SEUs occurring in conventional clock tree circuits. Other clock splitters can also be used to achieve other levels of SEU tolerance such as, e.g., U.S. patent application Ser. No. 09/559,659 (Attorney Docket No. FE-00432) entitled "Method and Apparatus for a Single Event Upset (SEU) Tolerant Clock Splitter" to Yoder, et al. filed coincident herewith, of common assignee to the present application, the contents of which are incorporated herein by reference in their entireties.

The SEU tolerant clock splitter circuit 400 can include an event offset delay 402 receiving an input clock signal 404 and providing two pairs of complementary clock output signals A0 406, A0N 408 and A0_DLY 410, A0N_DLY 412. Undelayed clock output signals A0 406 and A0_DLY 410 are inputs to an inverting event blocking filter 414. Delayed clock output signals 408 and 412 are inputs to a second inverting event blocking filter 416. Event blocking filter 414 is enabled by an enable signal 434 and event blocking filter 416 is enabled by an enable signal 436. Inphase output signal pairs 418, 420 and 422, 424 of event blocking filters 414 and 416, respectively, are inputs to an inverting clock driver 426 or 428, respectively. Inverting clock drivers 426 and 428 each provide one of a pair of complementary non-overlapping clock driver output signals PC0 324 and PB0 326, respectively.

Each of inverting event blocking filters 414 or 416 compares a respective undelayed clock output signal A0 406 or A0N 408 with a corresponding delayed clock output signal A0_DLY 410 or A0N_DLY 412. In response to that comparison each event blocking filter 414 or 416 provides pairs of inverted in phase output signals 418, 420 and 422, 424, respectively. Output signal 420 from inverting event blocking filter 414 is passed as a feedback input to inverting event blocking filter 416. Similarly, output signal 424 from inverting event blocking filter 416 can be passed as a feedback input to inverting event blocking filter 414.

Figure 4B:
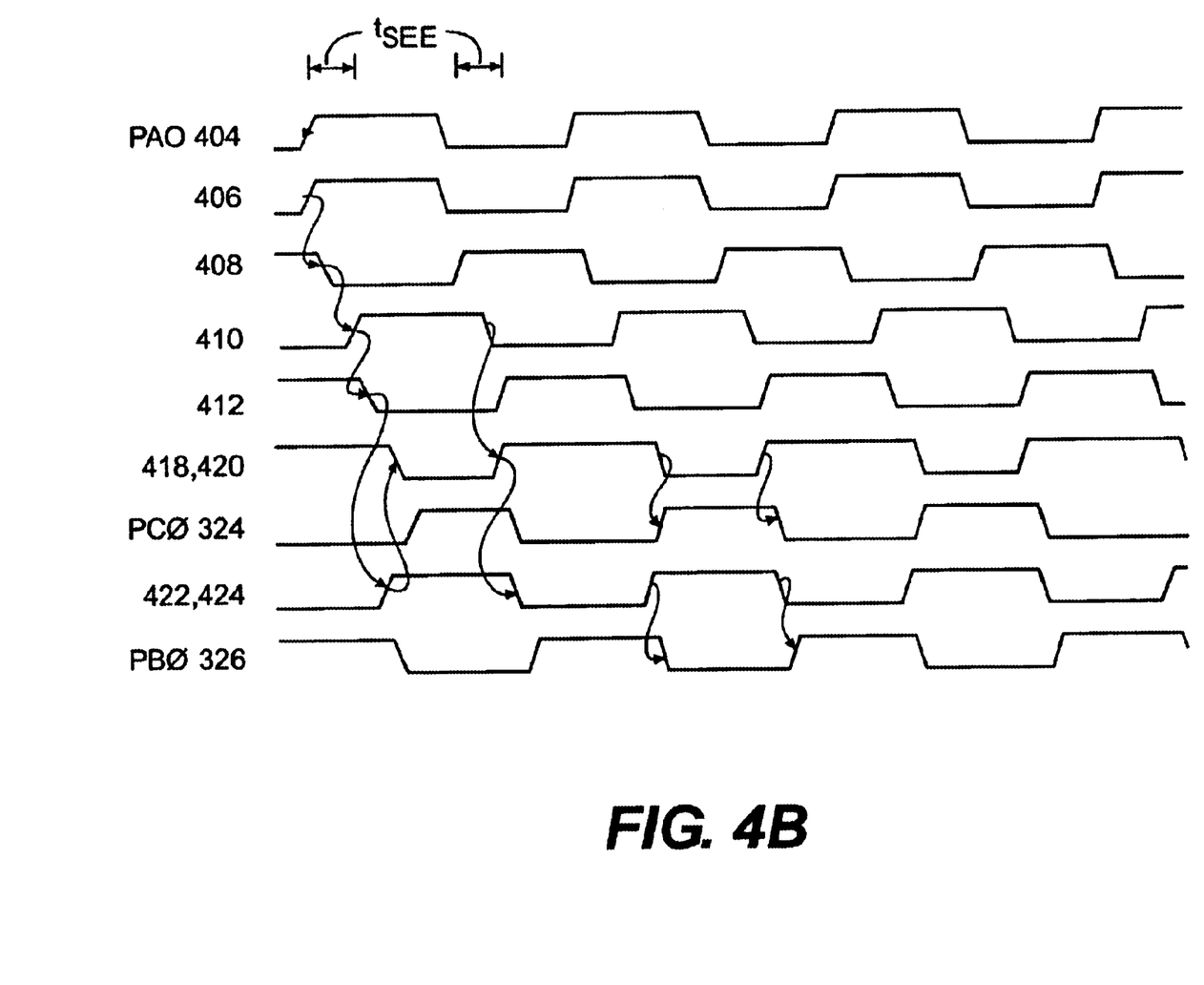
FIG. 4B is an example timing diagram for the exemplary embodiment of the SEU tolerant clock splitter circuit.

FIG. 4B is a timing diagram for the SEU tolerant clock splitter circuit 400 of FIG. 4A with timing edge relationships represented by arrows. The in-phase output signals 418, 420 and 422, 424 of each of inverting event blocking filters 414, 416, respectively, do not switch state until all input signals are at the same logic level. Thus, clock phase output signals A0 406, A0_DLY 410 and of A0N 408, A0N_DLY 412 must have switched states before in-phase output signals 418, 420 and 422, 424 switch state. The delay of the event offset delay circuit 402 can be sized such that the delayed output signals A0_DLY 410 or A0N_DLY 412 can be delayed from signal A0 406 and A0N 408, respectively, by $t_{SEE}$, typically 0.5 ns for 0.5 cm logic.

Accordingly, a false clock pulse will never cause the inverting event blocking filters 414, 416, to switch because the delay insures that a false pulse is not on both the undelayed output signal A0 406, A0N 408 and the delayed output signal A0_DLY 410, A0N_DLY 412, simultaneously. Thus, the inverting clock drivers 426, 428 ignore a false low pulse signal on either inphase output of either of inverting event blocking filters 414, 416. The exemplary clock splitter 400 thereby avoids inadvertently driving the driver's PC0 clock driver output signal 324 or PB0 clock driver output signal 326 high to inadvertently set either the first latch 304 or the second latch 306 of FIG. 3 in response to a SEE.

The feedback input 420, 424 to event blocking filters 414, 416, respectively, must be high in order to drive the in-phase output clock signals 418, 420 and 422, 424 low. So, both event blocking filter output signal pairs 418, 420 and 422, 424 must be high before either signal pair can be driven low. Thus, when these in phase output signal pairs 418, 420 and 422, 424 are inverted by inverting clock drivers 426 and 428, respectively, the resulting pair of complementary clock driver output signals 324, 326 are never high simultaneously and, therefore, are non-overlapping.

Figure 5A:
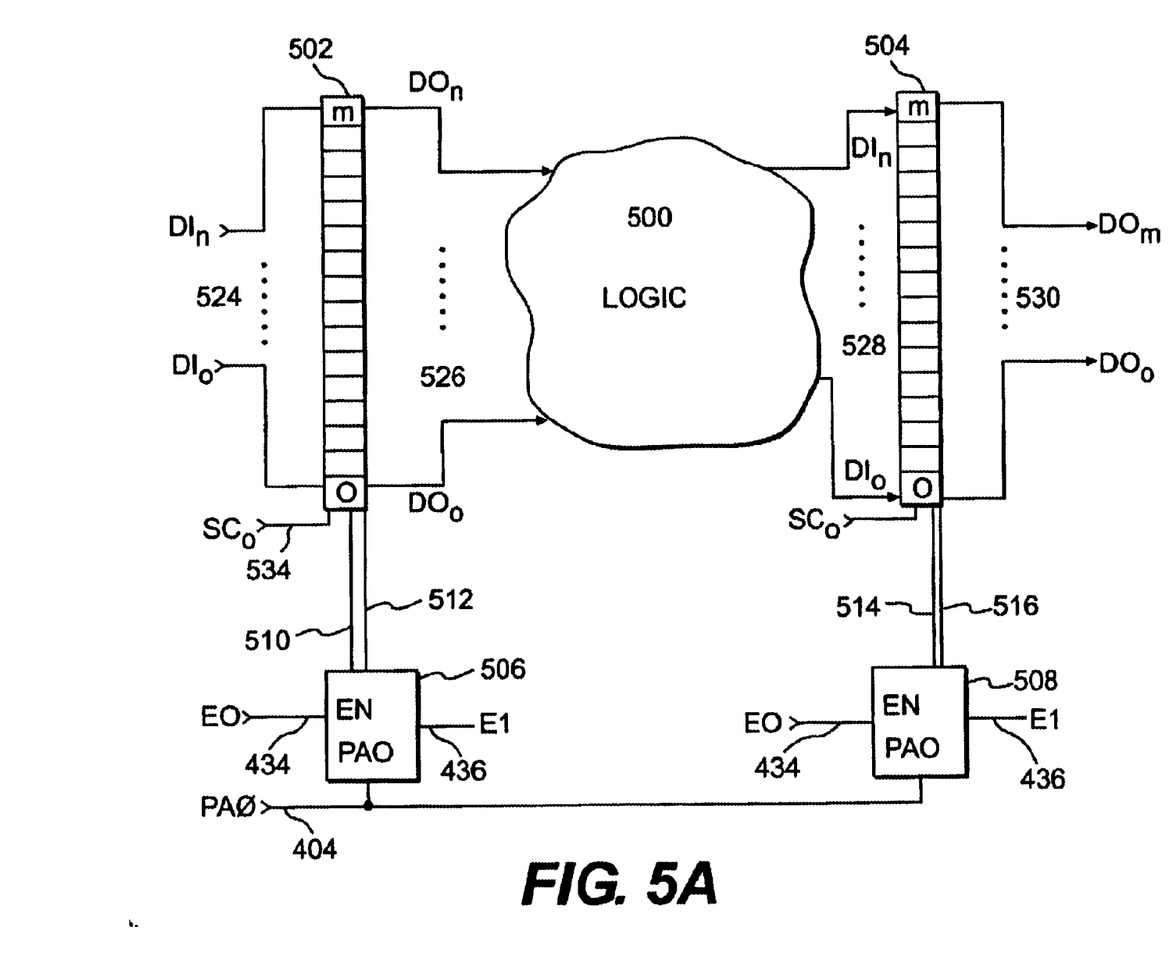
FIG. 5A is an example of a cross-sectional view of an exemplary embodiment of an integrated circuit chip for space-based applications with LSSD testable logic between two exemplary scannable registers of hybrid flip flops of the present invention.

FIG. 5A is a cross sectional view of an exemplary embodiment integrated circuit (IC) chip for space-based applications. Level sensitive scan design (LSSD) testable logic 500 is bounded by two serially scannable registers 502, 504. Each register 502, 504, is clocked by an independent clock driver 506, 508 that includes one or more SEU tolerant clock splitter circuits 400. Clock output pairs 510, 512 and 514, 516 from each clock driver 506, 508 are provided to registers 500, 502, respectively. Each pair represents one or more pairs of clock splitter circuit outputs 430, 432.

During normal operation, all latches of the registers 502, 504 operate as scan d flip flops and are set to select a data or logic input. Both clock enables 518, 520 are high, enabling both clock drivers 506, 508. Input clock 522 is buffered and split in clock drivers 504, 506 and then passed as clock output pairs 510, 512 and 514, 516 to registers 502, 504, which are operating as scan dff resisters.

In a typical cycle of clock 522, input data from other logic (not shown) is passed to register 502 on inputs $DI_0$–$DI_n$ 524. Data, latched in register 502 in the previous clock cycle, passes out of register 502 on outputs $DO_0$–$DO_n$ 526, propagating through logic 500 to inputs 528 of register 504. Register 504, in turn, is passing data that was latched in the previous clock cycle on outputs $DO_0$–$DO_n$ 530 to subsequent logic, also not shown. On the subsequent clock cycle, data from logic 500 is latched in register 504 and, on the next subsequent cycle, register 504 passes that latched data to subsequent logic.

Figure 5B:
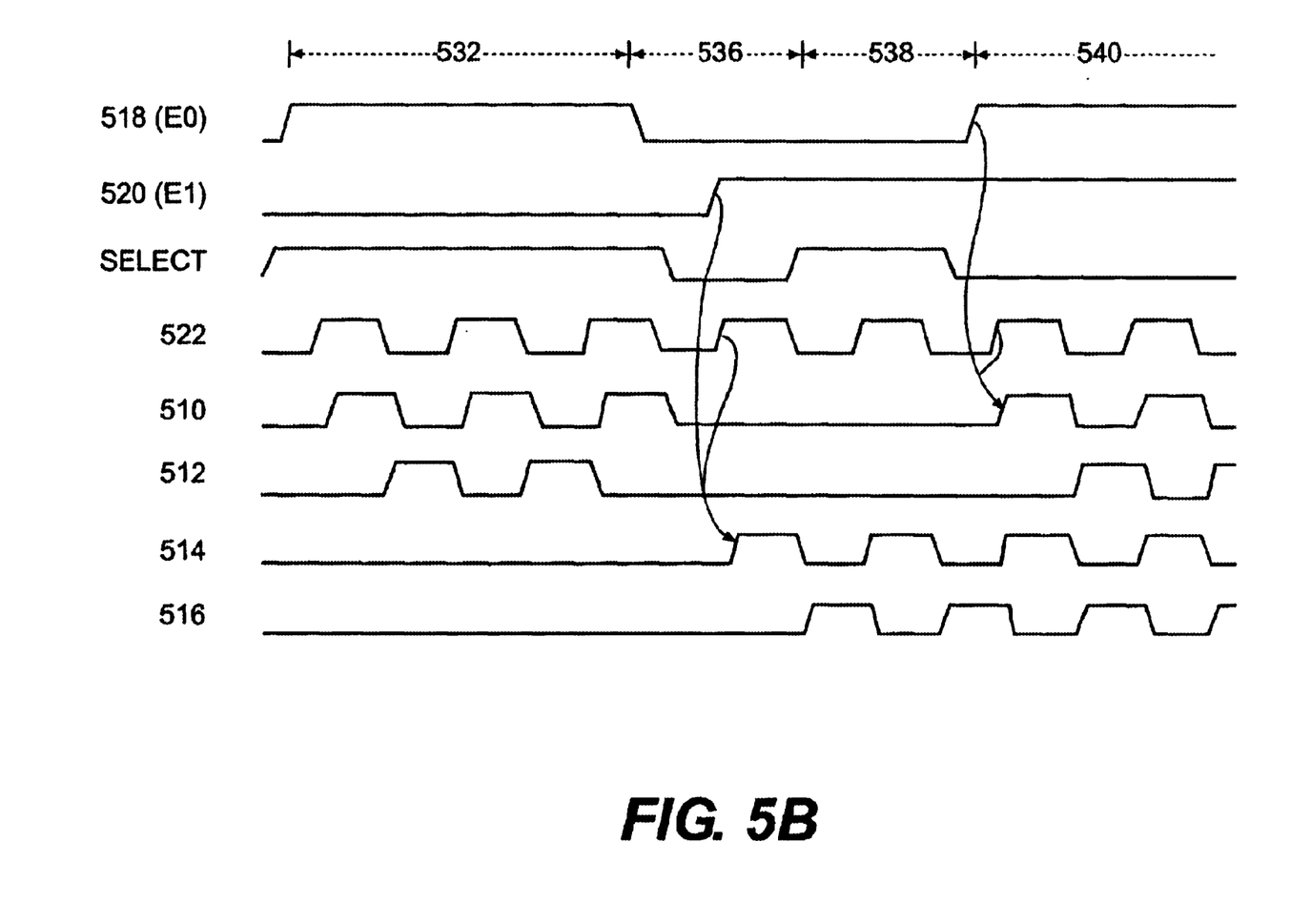
FIG. 5B is a timing diagram for the IC depicted in the cross-sectional view of FIG. 5A.

FIG. 5B is a timing diagram of a typical LSSD test for the cross section of FIG. 5A. In the first test phase as represented in the period labeled 532, the latches operate as LSSD latches. Latches in the register 502 are set, as represented by SELECT, to select a SCANIN input, thus configuring register 502 as a first-in first-out serial register. Initially, the SEU clock splitter enables E0, E1 are low. Enable E0 518 is driven high, individually, selecting one register 502 by enabling clock splitters 400 in clock driver 506. The clocks 514, 516 for unselected register 504 are held low because enable E1 520 is low, in this example. So, in the first test phase 532;, the enabled clocks 510, 512 clock register 502 to serially scan test data in on $SC_0$ 534 (which is the SCANIN input for the scan chain) until test data is loaded into register 502.

After loading test data into register 502, in test phase 536, enable E0 518 is driven low to disable clocks 510, 512 and the latch data inputs are selected as represented by SELECT switching state. Then, enable E1 520 is driven high to enable SEU clock splitters 400 in clock driver 508. After a single pulse or the PA0 clock 522, results of the test data on the logic are captured in the first level sensitive latches 304 in register 504.

Next, in test phase 538, the SCANIN input 534 is selected again as represented by SELECT switching. The captured test results are serially scanned out on $DO_n$. Finally, the circuit is returned to normal operation in phase 540 as the data input is selected for all latches and both clock drivers 506, 508 are enabled.

Thus, the entire logic 500 may be tested using ATPG or LSSD techniques, while operating normally as a scan dff design that has additional, normally unavailable SEE hardening. Further, the exemplary embodiment hybrid design has eliminated the LSSD need for individual A0, C0 clocks.

Thus, the combination of latch circuit 300 and clock splitter circuit 400, during normal operation, perform the function of a D-flip flop 200. The combination has the corresponding inputs (CLOCKIN, DATAIN, SCANIN, SELECT) and outputs (DATAOUT) as D-flip flop 200. Therefore the circuits 300, 400 in combination can be represented to ECAD logic synthesis and scan creation tools a d-flip flop 200. Therefore, the present invention hybrid flip flop 300 can be used in an automation process in combination with a clock splitter 400, permitting the use of the many standard logic synthesis algorithms and for scan strings in creating of edge triggered logic.

While the invention has been described in terms of preferred embodiments, those skilled in the art will recognize that the invention can be practiced with modification within the spirit and scope of the appended claims.

What is claimed is:

1. An integrated circuit comprising:

an input multiplexer;

a first latch selectively coupled to an output of said input multiplexer;

a second latch selectively coupled to an output of said first latch;

a first clock input signal selectively coupling said first latch to said input multiplexer output;

a second clock input signal, non-overlapping and separate from said first clock input, selectively coupling said first latch to said second latch;

a clock splitter for filtering radiation pulses generating the first and second clock input signals; and test logic coupled to the latches for scan testing the latches.

2. The circuit according to claim 1, wherein said input multiplexer is a 2:1 input multiplexer.

3. The circuit according to claim 2, wherein said input multiplexer includes a scan input signal and a data input signal.

4. The circuit according to claim 3, wherein said first latch is coupled to said input multiplexer by a first pair of pass gates, said first pair of pass gates being gated by said first clock input signal.

5. The circuit according to claim 4, wherein said second latch is coupled to said first latch by a second pair of pass gates, said second pair of pass gates being gated by said second clock input signal.

6. The circuit according to claim 1, wherein said first clock input signal is coupled to a first clock input signal of at least one other flip flop for radiation hardened integrated circuits and said second clock input signal is coupled to a second clock input signal of said at least one other flip flop.

7. An integrated circuit comprising at least one scannable register, said at least one scannable register comprising:
   a plurality of radiation hardened flip flops, each of said plurality of radiation hardened flip flops comprising:
      an input multiplexer;
      a first latch,
      a first pass gate pair selectively coupling an output of said input multiplexer to an input of said first latch,
      a second latch, and
      a second pass gate pair selectively coupling an output of said first latch to an input of said second latch;
      a first clock input signal selectively coupling said input of said first latch to said output of said input multiplexer; and
      a second clock input signal non-overlapping and separate from said first clock input, selectively coupling said output of said first latch to said input of said second latch; and
   a clock splitter for filtering radiation pulses generating the first and second clock input signals; and
   test logic coupled to the flip flops for scan testing the flip flops.

8. The circuit according to claim 7, wherein said input multiplexer is a 2:1 input multiplexer.

9. The circuit according to claim 8, wherein said input multiplexer includes a scan input and a data input, said plurality of radiation hardened flip flops being serially coupled into a scan string, an output of a first of said plurality of radiation hardened flip flops of said scan string being coupled to a scan input of a next of said plurality of radiation hardened flip flops of said scan string.

10. The circuit according to claim 9, wherein a scan input of each remaining of said plurality of radiation hardened flip flops is coupled to an output of another of said plurality of radiation hardened flip flops.

11. A circuit according to claim 10, wherein said at least one scannable register is one or more pairs of said scannable registers, a first of each of said pairs of scannaable registers providing an input to a logic circuit and a second of each of said pairs of scannable registers receiving an output of said logic circuit.

12. An integrated circuit comprising:
   a plurality of logic circuit providing a plurality of logic functions;
   a first clock input signal;
   a second clock input signal non-overlapping and separate from said first clock input signal;
   a clock splitter for filtering radiation pulses generating the first and second clock input signals; and
   test logic coupled to the the plurality of logic functions for scan testing the logic functions;
   a plurality of scannable registers for storing inputs to said plurality of logic functions and outputs from said plurality of logic functions, each of said plurality of scannable registers including a plurality of radiation hardened latches, wherein each of said plurality of radiation hardened latches comprises:
      an input multiplexer selecting between a scan input and a data input,
      a first latch selectively coupled to an output of said input multiplexer responsive to said first clock input signal, said first latch storing a state of said output of said input multiplexer, and
      a second latch selectively coupled to an output of said first latch responsive to said second clock input signal, said second latch storing a state of said output of said first latch and providing a radiation hardened latch output responsive to said state of said output of said first latch stored in said second latch; and
   each of said inputs to said plurality of logic functions being one of said radiation hardened latch outputs from one of said plurality of scannable registers, and each of said outputs from said plurality of logic functions being an input to another of said plurality of scannable registers.

13. The circuit according to claim 12, wherein said input multiplexer is a 2:1 input multiplexer.

14. The circuit according to claim 13, wherein said input multiplexer includes a scan input and a data input, said plurality of radiation hardened latches being serially coupled into one or more scan strings, an output of a first of said plurality radiation hardened latches of said scan string being coupled to a scan input of a next of said plurality of radiation hardened latches of said scan string.

15. The circuit according to claim 14, wherein a scan input of each remaining of said plurality of radiation hardened latches is an output of another of said plurality of radiation hardened latches, and wherein during a test operation test pattern data is scanned into one of said scan strings and test result data is scanned out of a second one of said scan strings.

16. The circuit according to claim 12, further comprising:
   a radiation hardened clock splitter, receiving a chip clock input signal and generating said first input clock signal and said second input clock signal responsive to said chip clock.

17. A flip flop for edge-triggered integrated circuits, said flip flop comprising:
   a 2:1 input multiplexer;
   a first pair of pass gates having inputs coupled to a pair of outputs of said 2:1 input multiplexer;
   a first latch having inputs coupled to outputs of said first pair of pass gates;
   a second pair of pass gates having inputs coupled to a pair of outputs of said first latch;
   a second latch having inputs coupled to outputs of said second pair of pass gates;
   a first clock input signal gating said first pair of pass gates; and
   a second clock input signal, gating said second pair of pass gates, wherein said first clock signal and said second clock signal are non-overlapping separate clock signals;
   wherein during test said flip flop is operative for functional testing using LSSD testing techniques and during normal operation said flip flop operates as an edge-triggered flip flop.

18. The flip flop according to claim 17, wherein said first latch and said second latch are radiation hardened latches.

19. The flip flop according to claim 18, wherein said 2:1 input multiplexer includes a scan input and a data input, said flip flop being serially coupled with additional of said flip flops into one or more scan strings, an output of a first said flip flop of each of said scan strings being coupled to a scan input of a next said flip flop of said scan string.

20. The flip flop according to claim 19, wherein said scan input of each remaining of said additional of said flip flops is an output of another of said additional said flip flops, wherein during a test operation test pattern data is scanned into one of said scan strings and test result data is scanned out on a second one of said scan strings.

21. The flip flop according to claim 18, wherein said flip flop, when clocked by an SEU tolerant clock splitter, is operable to perform as a scab d flip flop for ECAD logic synthesis.

22. The method of operating an integrated circuit (IC), said IC having a test mode of operation and a functional mod of operation, said method comprising the steps of:
   a) configuring said IC in its test mode and testing said IC using LSSD test methods; and
   b) configuring said IC in it functional mode and providing a clock to an input to said IC, wherein single event upsets occuring in clock trees on said IC is not propagated as clock pulses to latches on said IC;
   wherein the clock includes a clock splitter for filtering radiation pulses.

23. The method of claim 22, wherein the step (a) of configuring the IC in test mode and testing comprises:

i) selecting a scan input to one or more scannable registers;
   ii) scanning a plurality of test patterns into said one or more scannable registers;
   iii) allowing said test patterns to propagate through logic being tested on said IC to an input to an other scannable register;
   iv) latching logic test results in said other scannable register;
   v) scanning test results out of said other scannable register; and
   vi) checking said test results for failures and analyzing any said failures to determine a cause for each of said failures.

24. The method of claim 23, wherein for any IC determined not to contain failures, said step (b) of configuring the IC in functional mode comprises:
   i) configuring said scannable registers to select a data input;
   ii) providing a clock to said IC;
   iii) splitting said clock into one or more pairs of complementary clocks; and
   iv) providing said pairs of complementary clocks to said scannable registers, wherein said registers are clocked by said pairs of complementary clocks, a first of each said pair loading data into first level sensitive latches and the second of said each pair passing said loaded data into second level sensitive latches.

* * * * *